United States Patent
Smick et al.

(10) Patent No.: US 6,956,223 B2
(45) Date of Patent: Oct. 18, 2005

(54) MULTI-DIRECTIONAL SCANNING OF MOVABLE MEMBER AND ION BEAM MONITORING ARRANGEMENT THEREFOR

(75) Inventors: Theodore H. Smick, Essex, MA (US); Frank D. Roberts, North Reading, MA (US); Marvin Farley, Ipswich, MA (US); Geoffrey Ryding, Manchester, MA (US); Takao Sakase, Rowley, MA (US); Adrian Murrell, Horsham (GB); Peter Edwards, Kingsfold (GB); Bernard Harrison, Copthorne (GB)

(73) Assignee: Applied Materials, Inc., Santa Clara, CA (US)

( * ) Notice: Subject to any disclaimer, the term of this patent is extended or adjusted under 35 U.S.C. 154(b) by 495 days.

(21) Appl. No.: 10/119,290

(22) Filed: Apr. 10, 2002

(65) Prior Publication Data

US 2003/0192474 A1 Oct. 16, 2003

(51) Int. Cl.$^7$ .................................................. B05C 5/00
(52) U.S. Cl. ............. 250/492.21; 118/620; 250/442.11; 414/217; 414/422
(58) Field of Search ........................ 250/492.21, 442.11, 250/440.11; 414/217, 422

(56) References Cited

U.S. PATENT DOCUMENTS

| | | | |
|---|---|---|---|
| 4,726,689 A | 2/1988 | Pollock | |
| 5,898,179 A | 4/1999 | Smick et al. | |
| 6,172,372 B1 * | 1/2001 | Vanderpot | 250/492.21 |
| 6,271,530 B1 | 8/2001 | Smick et al. | |
| 6,274,875 B1 * | 8/2001 | Smick et al. | 250/492.21 |
| 6,350,991 B1 * | 2/2002 | Ryding | 250/492.21 |
| 6,437,351 B1 * | 8/2002 | Smick et al. | 250/492.21 |

FOREIGN PATENT DOCUMENTS

| | | |
|---|---|---|
| EP | 1047102 A2 | 4/2000 |
| EP | 1 083 587 A2 | 3/2001 |
| GB | 2 355 336 | 4/2001 |
| GB | 2360332 A | 9/2001 |
| WO | WO 00/05744 A1 | 2/2000 |

* cited by examiner

*Primary Examiner*—Nikita Wells
*Assistant Examiner*—Zia R. Hashmi
(74) *Attorney, Agent, or Firm*—Boult Wado Tennant

(57) ABSTRACT

Semiconductor processing apparatus is disclosed which provides for movement of a scanning arm 60 of a substrate or wafer holder 180, in at least two generally orthogonal directions (so-called X-Y scanning). Scanning in a first direction is longitudinally through an aperture 55 in a vacuum chamber wall. The arm 60 is reciprocated by one or more linear motors 90A, 90B. The arm 60 is supported relative to a slide 100 using gimballed air bearings so as to provide cantilever support for the arm relative to the slide 100. A compliant feedthrough 130 into the vacuum chamber for the arm 60 then acts as a vacuum seal and guide but does not itself need to provide bearing support. A Faraday 450 is attached to the arm 60 adjacent the substrate holder 180 to allow beam profiling to be carried out both prior to and during implant. The Faraday 450 can instead or additionally be mounted adjacent the rear of the substrate holder or at 90° to it to allow beam profiling to be carried out prior to implant, with the substrate support reversed or horizontal and out of the beam line.

44 Claims, 9 Drawing Sheets

FIG. 6.
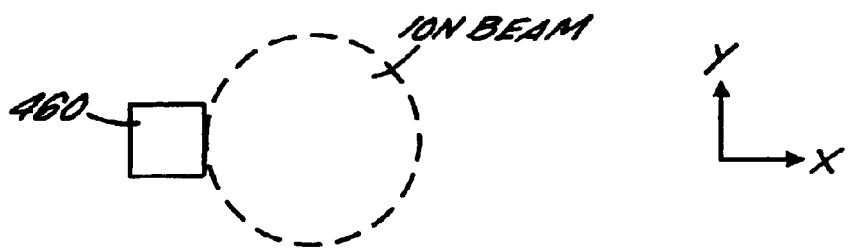
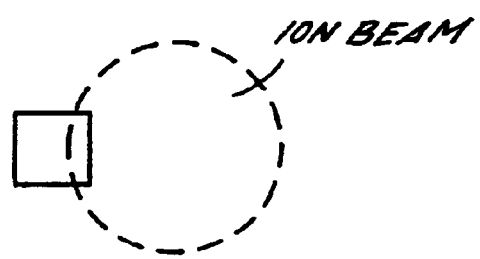
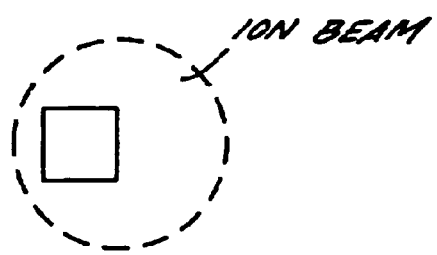
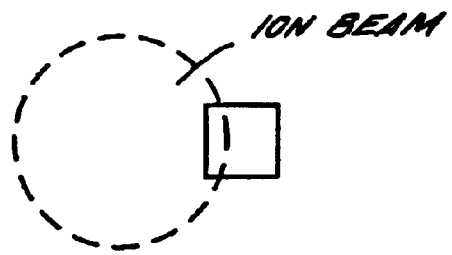
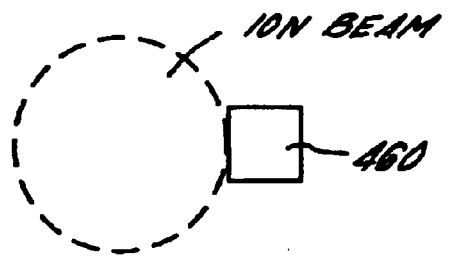

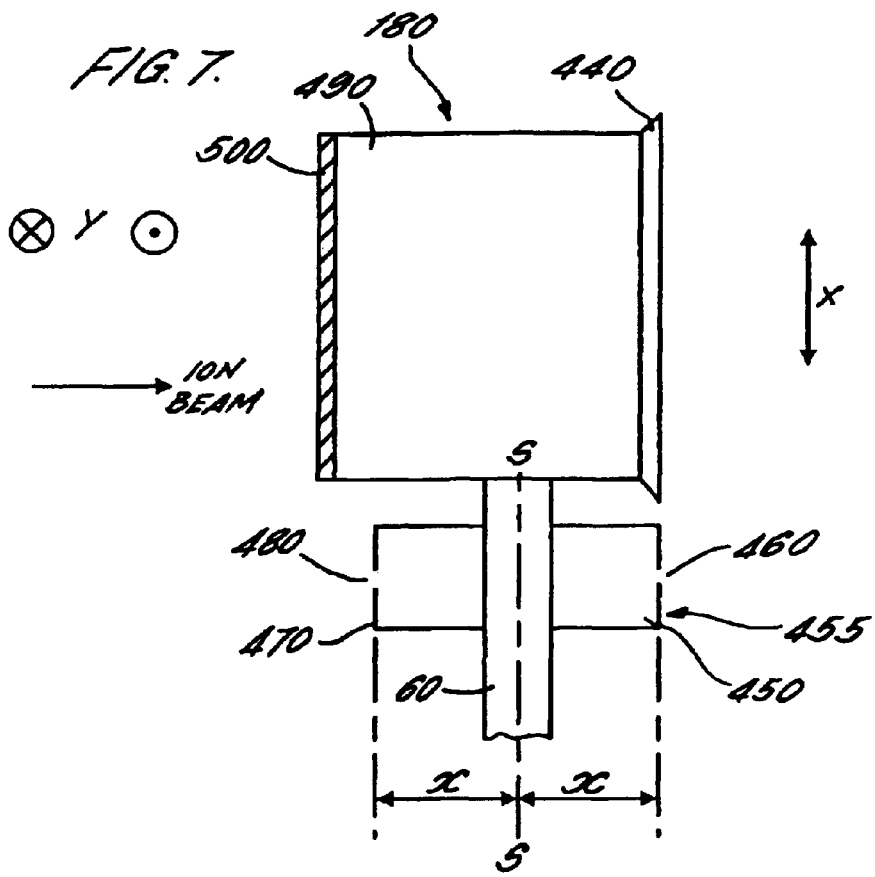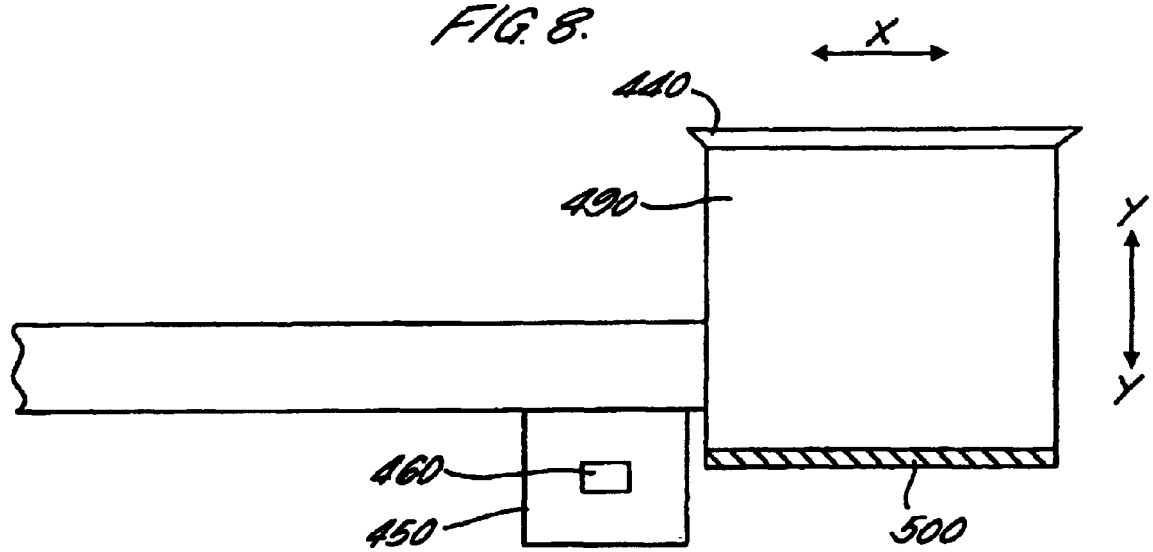

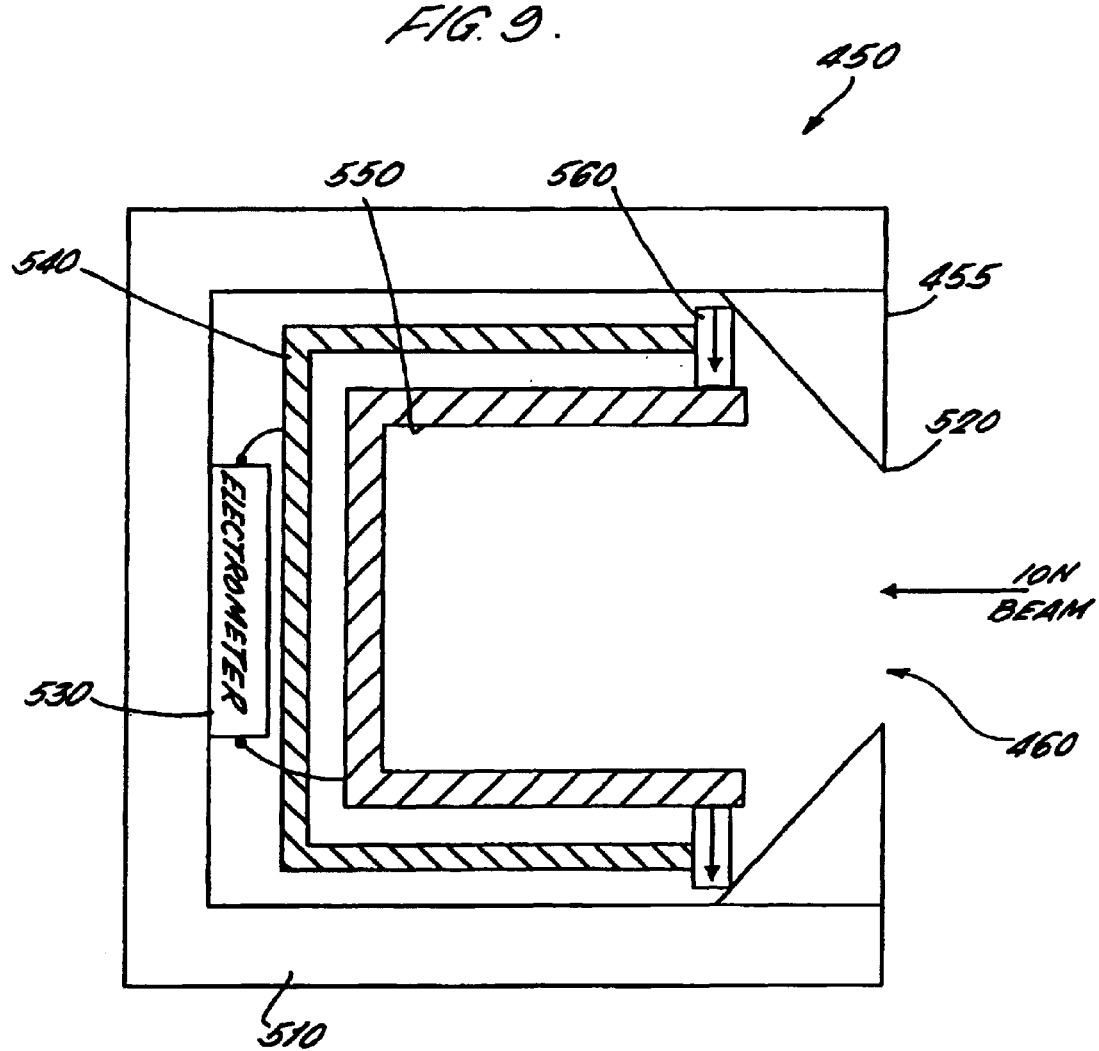

MULTI-DIRECTIONAL SCANNING OF MOVABLE MEMBER AND ION BEAM MONITORING ARRANGEMENT THEREFOR

FIELD OF THE INVENTION

This invention relates to a method and an apparatus for scanning of a movable member such as a semiconductor wafer holder in a plurality of different directions relative to an ion beam. The invention also relates to an ion beam monitoring arrangement for use with such an apparatus.

BACKGROUND OF THE INVENTION

In a typical ion implanter, a relatively small cross-section beam of dopant ions is scanned relative to a silicon wafer. This can be done in essentially one of three ways: scanning of the beam in two directions relative to a stationary wafer, scanning of the wafer in two directions relative to a stationary beam, or a hybrid technique wherein the beam is scanned in one direction whilst the wafer is mechanically scanned in a second, typically orthogonal direction.

Each technique has advantages and disadvantages. With smaller silicon wafers, the traditional approach was to mount a batch of wafers at the end of spokes on a rotating wheel. The wheel was then scanned to and fro to cause a fixed direction ion beam to impinge upon each wafer in turn.

For implantation into larger (300 mm) wafers, batch processing is currently not preferred. One reason for this is that the individual cost of each wafer introduces a significant financial risk should problems arise during implantation. Electrostatic or magnetic scanning of an ion beam in orthogonal directions relative to a stationary wafer tends to result in beams of poorer quality, and current single wafer scanning techniques tend to employ the hybrid mechanical/electrostatic scanning as outlined above. An arrangement suitable for achieving this is described in our commonly assigned U.S. Pat. No. 5,898,179, the contents of which are incorporated by reference in their entirety. Here, the ion beam is magnetically scanned in a first direction perpendicular to the beam line axis in the ion implanter, whilst the wafer is mechanically moved in a second, generally orthogonal axis.

There are, nevertheless, advantages (in terms of beam profile, beam stability and minimisation of the length of the beam line) in maintaining a static beam direction. This in turn requires dual direction scanning of the wafer. It is one object of the present invention to provide an arrangement which achieves this.

Determining the beam profile i.e., the ion density as a function of distance across the beam in a given direction) is generally desirable, but particularly when the beam is of fixed direction relative to the implantation chamber. This is because the speed of passage of the wafer across the beam is then slower than for hybrid scanning. For a reasonable throughput of wafers, therefore, it is necessary to minimise the raster pitch. It is then helpful to determine, for example, the beam profile (that is, the beam current intensity across the area of the beam) both prior to and during implantation. Profiling the beam prior to an implant allows the scanning of the wafer during implant to be controlled so as to ensure close uniformity across the wafer, rather than 'stripes' of lower or higher ion densities.

A number of different approaches to beam profiling are known in the art. For example, in our commonly assigned PCT Patent Application WO-A-00/05744, the signal output from the beam stop (located downstream of the batch processing wafer holder) is employed to obtain information on beam width, height and continuity during implantation. Such signal processing relies upon the gap between wafers on the rotary wafer holder and is accordingly not appropriate for single wafers.

Other beam profiling techniques include a travelling Faraday and a pair of Faradays held in a fixed position but spaced along the beam line as described in the above-referenced U.S. Pat. No. 5,898,179.

This invention also seeks to provide an improved ion beam profiling arrangement, therefore, particularly for use during set-up prior to implant.

SUMMARY OF THE INVENTION

One aspect of the present invention accordingly provides semiconductor processing apparatus which provides for movement of an elongate member, such as the arm of a substrate or wafer holder, in at least two generally orthogonal directions (so-called X-Y scanning). Scanning in a first direction is longitudinally through an aperture in a vacuum chamber wall. The elongate member is reciprocated, for example, by an elongate member driver such as a pair of linear motors. The elongate member and the driver are each preferably mounted on the carrier which in turn is driven in a second direction generally orthogonal to the first.

To achieve the longitudinal reciprocation of the elongate member, the carrier preferably includes a slide. The elongate member is supported relative to the slide which is in turn preferably cantilevered from a part of the carrier. It is to be understood that the term "cantilevered" refers not only to horizontal support, but also to vertical or other orientations of support.

In a particularly preferred feature of the invention, the elongate member is spaced from the slide by one or more gimballed bearings located towards a first end of the elongate member. These bearings provide cantilevered support for the elongate member as it reciprocates along the slide. Using this technique, a feedthrough for the elongate member into the vacuum chamber can be provided which acts as a vacuum seal but does not itself need to provide bearing support. The feedthrough is preferably compliant and another aspect of this invention provides for a plurality of elastomeric gaskets or the like to act as a vacuum seal and to permit compliance of the feedthrough relative to the carrier or vacuum chamber wall.

The feedthrough itself is also preferably a rotary feedthrough. This permits rotation of the elongate member about an axis parallel with the said longitudinal direction.

In still a further aspect of the invention, a Faraday is attached to the elongate member adjacent a substrate support. This allows beam profiling (the ion beam having a fixed direction relative to the vacuum chamber) to be carried out in the plane of the substrate to be implanted. Not only may beam profiling be carried out prior to implant, to allow (for example) the beam line to be "tuned", but the presence of the Faraday adjacent the front face of the substrate support allows the beam to be profiled during a part of an implant cycle as well.

Where the elongate member is rotatable about its own axis, then a Faraday can instead or additionally be mounted adjacent the rear of the substrate support. Beam profiling can then be carried out with the substrate support reversed (that is, rotated through 180°. By coating the reverse side of the substrate support with a semiconductor material (e.g. silicon), beam profiling can be carried out without the need for a dummy wafer fitted to the 'front' of the substrate support. As an alternative, or additionally, the Faraday may be mounted so that its entrance is at 90° to the plane of the front and rear faces of the substrate support.

The invention, in a first aspect, accordingly provides semiconductor processing apparatus, comprising: a vacuum chamber having a chamber wall with an aperture therein; an elongate member extending through the aperture in the chamber wall and being movable in a longitudinal direction through the chamber wall; an elongate member driver arranged to cause reciprocation of the elongate member in the said longitudinal direction; a carrier external of the vacuum chamber, for supporting the elongate member and driver; and a carrier driver arranged to cause reciprocation of the carrier in a direction generally perpendicular to the direction of reciprocation of the movable elongate member.

According to a second aspect of the present invention, there is provided semiconductor processing apparatus, comprising: a vacuum chamber having a chamber wall; an elongate member extending horizontally through the chamber wall and being movable in a longitudinal direction through the chamber wall; an elongate member driver arranged to drive the elongate member in the said longitudinal direction; a carrier for supporting the elongate member and driver, the carrier being external of the vacuum chamber and providing cantilever support for an external end of the elongate member; and a feedthrough into the vacuum chamber, the feedthrough receiving the elongate member and including a vacuum seal for sealing against the elongate member.

In a further aspect, there is provided a method of mounting an elongate member for reciprocal movement into and out of a vacuum chamber of a semiconductor processing apparatus, the method comprising: (a) supporting the elongate member relative to a carrier, the elongate member being supported by at least one load bearing device located toward a first end of the said elongate member, wherein the first end is external to the vacuum chamber; and (b) mounting the elongate member through a vacuum seal between the interior of the vacuum chamber and the exterior thereof; wherein the load presented by the said elongate member is substantially borne by the or each load bearing device such that the vacuum seal acts as a non-load bearing guide for the elongate member during reciprocal movement.

In still a further aspect there is provided a rotary and linear vacuum seal for feedthrough of an elongate member into a vacuum chamber of a semiconductor processing apparatus, the vacuum chamber having a chamber wall member, the vacuum seal comprising: an outer mounting fixed to the wall member and having a longitudinal axis extending in a direction through the chamber wall member; an inner bearing mounted radially inwardly of the outer mounting, the inner bearing being movable relative to the outer mounting, being sized to receive the elongate member therethrough, and likewise having a longitudinal axis extending in a direction through the chamber wall; and a plurality of compliant gaskets arranged between the inner bearing and the outer mounting, the compliant gaskets being axially spaced along the longitudinal axes of the inner bearing and outer mounting.

A further aspect of the present invention provides semiconductor processing apparatus, comprising: a vacuum chamber having a chamber wall with an aperture therein; a scanning arrangement including an elongate arm extending through the aperture in the chamber wall, and a substrate support attached to a first end of the elongate arm and located within the vacuum chamber, the substrate support comprising a front face adapted to receive a substrate to be processed, and a rear face opposed to the front face; scanning arrangement drive means for moving the beam scanning arrangement in a first direction generally longitudinally through the chamber wall, and in a second direction generally orthogonal to the said first direction; and a Faraday, mounted adjacent to and in fixed relation to the said substrate support.

In yet another aspect, there is provided a method of profiling an ion beam in a semiconductor processing apparatus, the apparatus comprising a vacuum chamber having a chamber wall with an aperture therein and a beam scanning arrangement including an elongate arm extending through the aperture in the chamber wall and a substrate support attached to a first end of the elongate arm and located within the vacuum chamber, the substrate support comprising a front face adapted to receive a substrate to be processed, and a rear face opposed to the front face; the method comprising: mounting a Faraday adjacent to and in fixed relation to the said substrate support; moving the beam scanning arrangement in one of a first direction generally longitudinally through the chamber wall, and a second direction generally orthogonal to the first direction, until the ion beam is generally aligned with the Faraday in that first or second direction respectively; scanning the beam scanning arrangement in the other of the said first and second directions such that the ion beam passes across the Faraday; obtaining a Faraday output signal as the beam scanning arrangement is scanned across the Faraday; and obtaining a profile of the ion beam in the said other of the first and second directions from the Faraday output signal.

The invention also extends to an ion implanter including the semiconductor processing apparatus and/or the vacuum feedthrough outlined above. It is to be understood, also, that each of the various aspects of the invention is by no means mutually exclusive and, indeed, the combination of various aspects of the invention provides benefits.

BRIEF DESCRIPTION OF THE DRAWINGS

The invention may be put into practice in a number of ways, and embodiments will now be described by way of example only and with reference to the accompanying drawings in which:

FIG. 1b shows a part section along the line AA of FIG. 1a;

FIG. 6 shows a schematic view of a part of the Faraday of FIG. 5 as it traverses an ion beam;

FIG. 7 shows a schematic side view of the substrate support and Faraday of FIG. 5;

FIG. 8 shows a schematic front view of an alternative arrangement of a substrate support and Faraday; and FIG. 9 shows a part-section through the Faraday of FIGS. 5 and 8.

DESCRIPTION OF THE PREFERRED EMBODIMENT

Figure 1A:
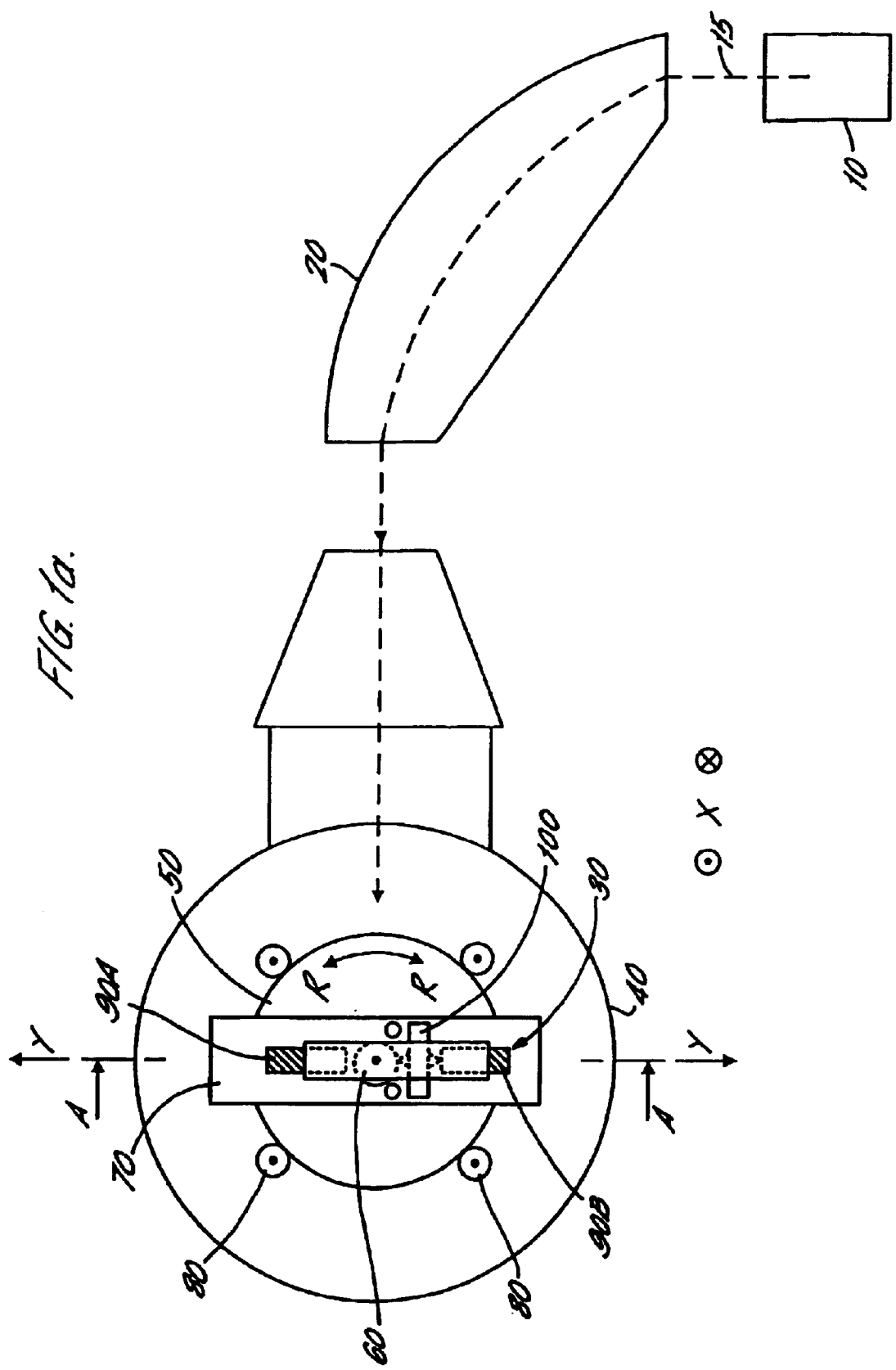
FIG. 1a shows a schematic side view of an ion implanter including a process chamber to which is mounted a substrate scanning arrangement including a scanning arm support structure in accordance with the present invention.
Figure 1B:
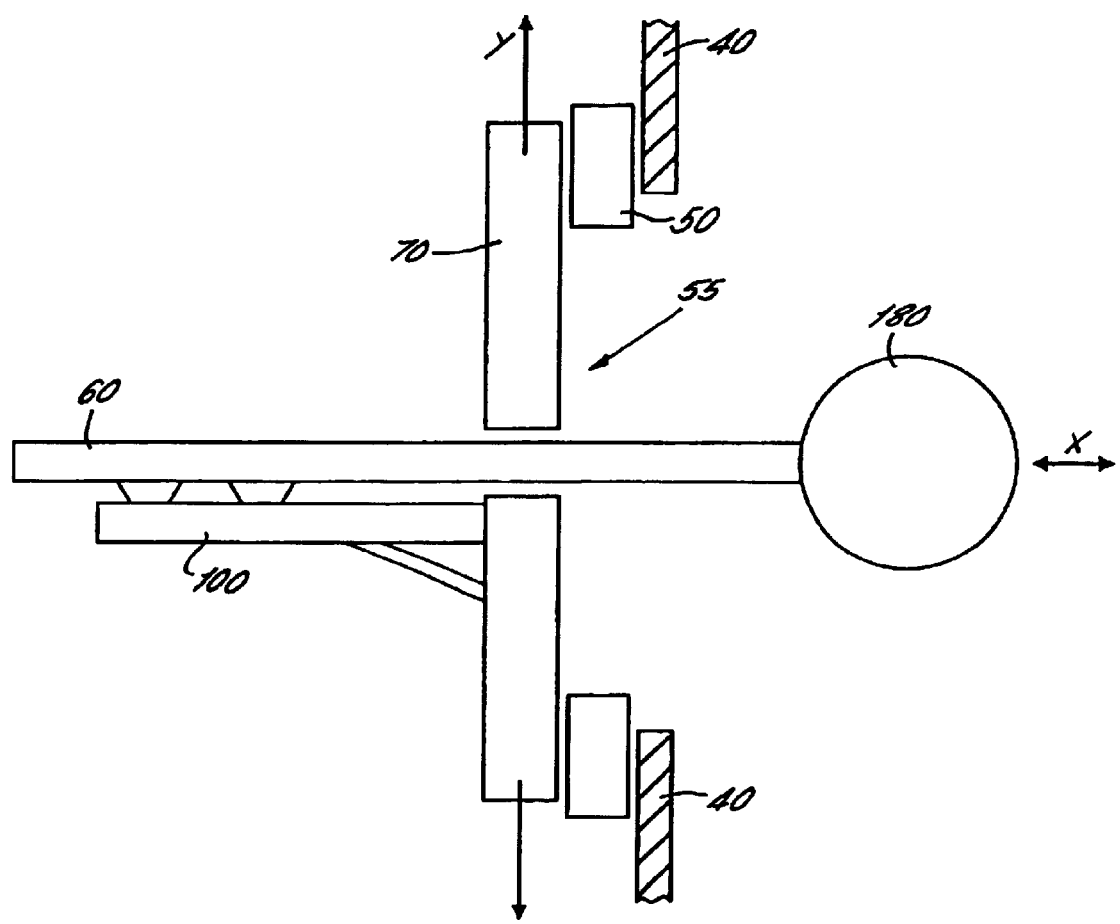

A schematic side view of an ion implanter is shown in FIG. 1a. A part sectional view along the line AA in FIG. 1a is shown in FIG. 1b. As best seen in FIG. 1a, the ion implanter includes an ion source 10 which is arranged to generate an ion beam 15. The ion beam 15 is directed into a mass analyser 20 where ions of a desired mass/charge ratio are selected electromagnetically. Such techniques are well known to those skilled in the art and will not be detailed further. It should be noted that, for convenience, the mass analyser 20 has been illustrated in FIG. 1a as bending the beam of ions from the source 10 in the plane of the paper, which is a vertical plane in the context of other parts of the illustrated implanter. In practice, the analyser 20 is usually arranged to bend this ion beam in a horizontal plane.

The ion beam 15 exiting the mass analyser 20 may be subject to electrostatic acceleration or deceleration of the ions, depending upon the type of ions to be implanted and the desired implantation depth.

Downstream of the mass analyser is a process or vacuum chamber 40 containing a wafer 180 to be implanted, as may be seen in FIG. 1b. In the present embodiment, the wafer is a single wafer, for example 200 mm or 300 mm in diameter.

The ion beam which exits the mass analyser 20 generally has a beam width and height which is substantially smaller than the diameter of the wafer to be implanted. The scanning arrangement of FIGS. 1a and 1b (explained in detail below) allows for scanning of the wafer in multiple directions such that the ion beam may be maintained, during implant, along a fixed axis relative to the vacuum chamber 40. Specifically, the wafer is mounted upon a substrate support which consists of a plate onto which the wafer is mounted within the vacuum chamber 40, and an elongate arm 60 connected to the plate.

The elongate arm 60 extends out through the wall of the process chamber in a direction generally perpendicular with the direction of the ion beam. The arm passes through a slot 55 (FIG. 1b) in a rotor plate 50 which is mounted adjacent to a side wall of the process chamber 40. The end of the scanning arm 60 is mounted through a sledge 70. The scanning arm 60 is substantially fixed relative to the sledge 70 in the Y-direction as shown in FIGS. 1a and 1b, and the scanning plane may also be rotated in the direction R (FIG. 1a) as explained further below. The sledge 70 is movable in a reciprocating manner relative to the rotor plate 70 in the direction Y shown in FIGS. 1a and 1b. This permits movement, also in a reciprocating manner, of the substrate in the process chamber 40.

To effect mechanical scanning in the orthogonal, X-direction (that is, into and out of the plane of the paper in FIG. 1a and left to right in FIG. 1b), the scanning arm 60 is mounted within a scanning arm support structure 30. The scanning arm support structure 30 comprises a pair of linear motors 90A, 90B which are spaced from the longitudinal axis of the scanning arm 60 above and below it as viewed in FIG. 1a. Preferably, the motors are mounted around the longitudinal axis so as to cause the force to coincide with the centre of mass of the scanning arm support structure 30. However, this is not essential and it will of course be understood that a single motor may instead be employed to reduce weight and/or cost.

The support structure 30 also includes a slide 100 which is mounted in fixed relation to the sledge 70. Movement of the linear motors along tracks (not shown in FIGS. 1a or 1b) disposed from left to right in FIG. 1b causes the scanning arm 60 likewise to reciprocate from left to right as viewed in FIG. 1b; the scanning arm 60 reciprocates relative to the slide 100 upon a series of bearings.

With this arrangement, the substrate is movable in two orthogonal directions (X and Y) relative to the axis of the ion beam 15 such that the whole substrate can be passed across the fixed direction ion beam.

Sledge 70 in FIG. 1a is shown in a vertical position such that the surface of the wafer is perpendicular to the axis of the incident ion beam. However, it may be desirable to implant ions from the ion beam into the substrate at an angle. For this reason, the rotor plate 50 is rotatable about an axis defined through its centre, relative to the fixed wall of the vacuum chamber 40. In other words, the rotor plate 50 is able to rotate in the direction of the arrows R shown in FIG. 1a.

Movement of the sledge 70 relative to the rotor plate 50 is facilitated with an air bearing between a surface of the rotor plate 50 and a surface of the sledge 70. Movement of the rotor plate 50 relative to the process chamber 40 is likewise facilitated with an air bearing between a surface of the rotor 50 and a surface of a stator (not shown) which is mounted upon a flange extending radially from a wall of the process chamber 40 adjacent the aperture therethrough. Radial movement of the rotor plate is constrained by a series of guide wheels 80 arranged around the circumference of the rotor plate 50. Unwanted axial movement of the rotor plate is prevented in use by the pressure differential between the two faces of the rotor plate; the outer face is at atmospheric pressure whereas the inner face is at a vacuum such that there is a significant force acting into the plane of the paper in FIG. 1a to maintain the rotor plate in position. The sledge 70 is likewise held against the rotor plate 50 by a pressure differential between an outer face of the sledge and an inner face of the sledge where it covers the aperture through the rotor plate and process chamber wall.

The details of the rotor plate 50 and its method of mounting relative to the stator on the process chamber wall (including the fluid bearing) are all described in detail in U.S. Pat. No. 5,898,179, the contents of which are incorporated herein in their entirety. The method of mounting of the sledge 70 for reciprocal movement in the Y-direction is likewise described in this patent. Details of a particularly suitable air bearing between the rotor plate and stator, and between the sledge and the rotor plate, which incorporates a porous graphite material and a differentially-pumped vacuum seal, are given in our copending U.S. application Ser. No. 09/527,029 (corresponding with published UK Patent Application No. GB-A-2,360,332), the contents of which are also incorporated herewith in their entirety. An annular piston member may be used to support the rotor plate 50 relative to the stator and thus to prevent "bowing" or "dishing" of the rotor plate 50, and this is described in commonly assigned U.S. Pat. No. B1-6,271,530. The contents of this patent are incorporated by reference as well.

Figure 2:
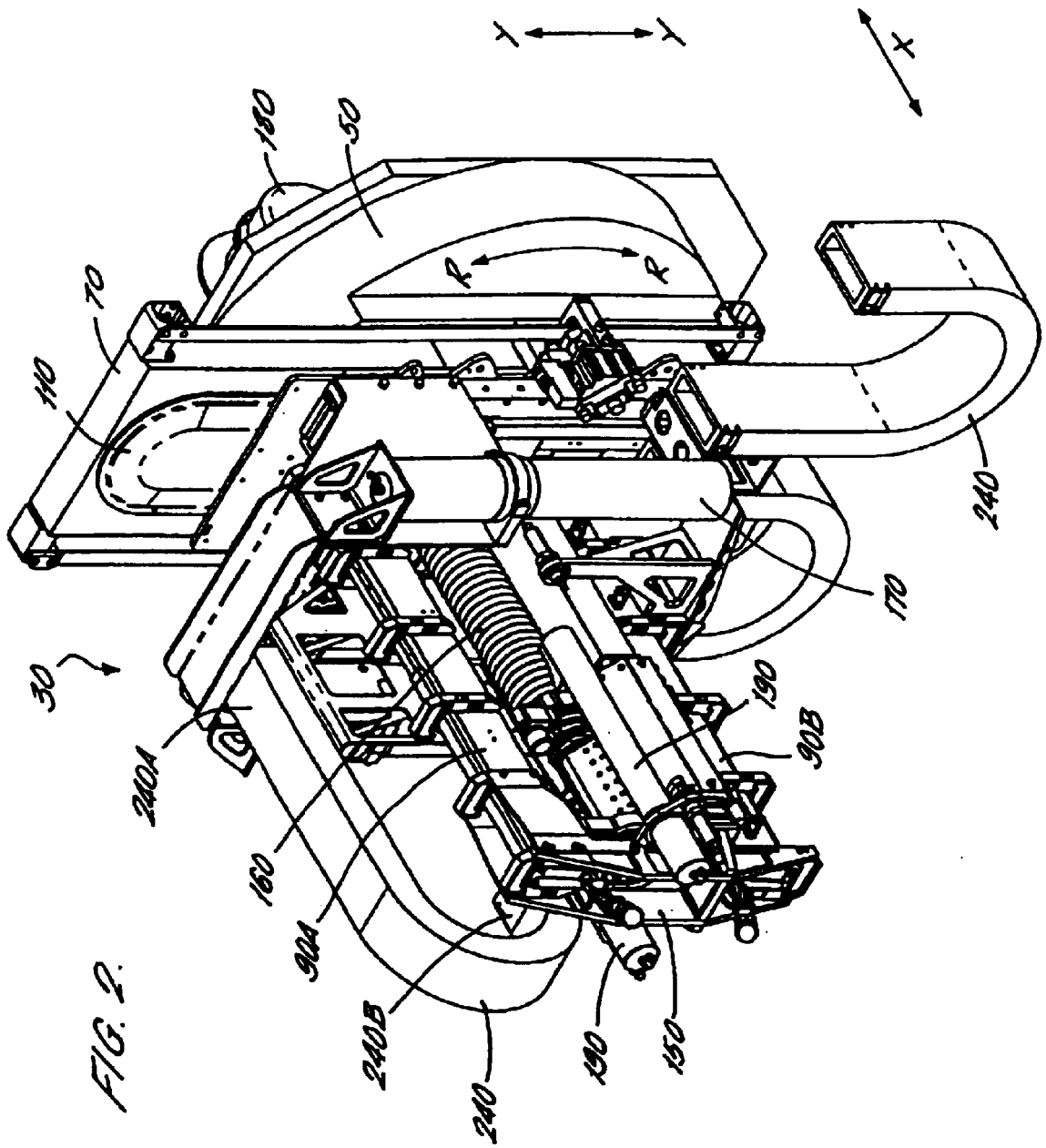
FIG. 2 shows a more detailed third angle projection of the substrate scanning arrangement of FIGS. 1a and 1b.
Figure 3:
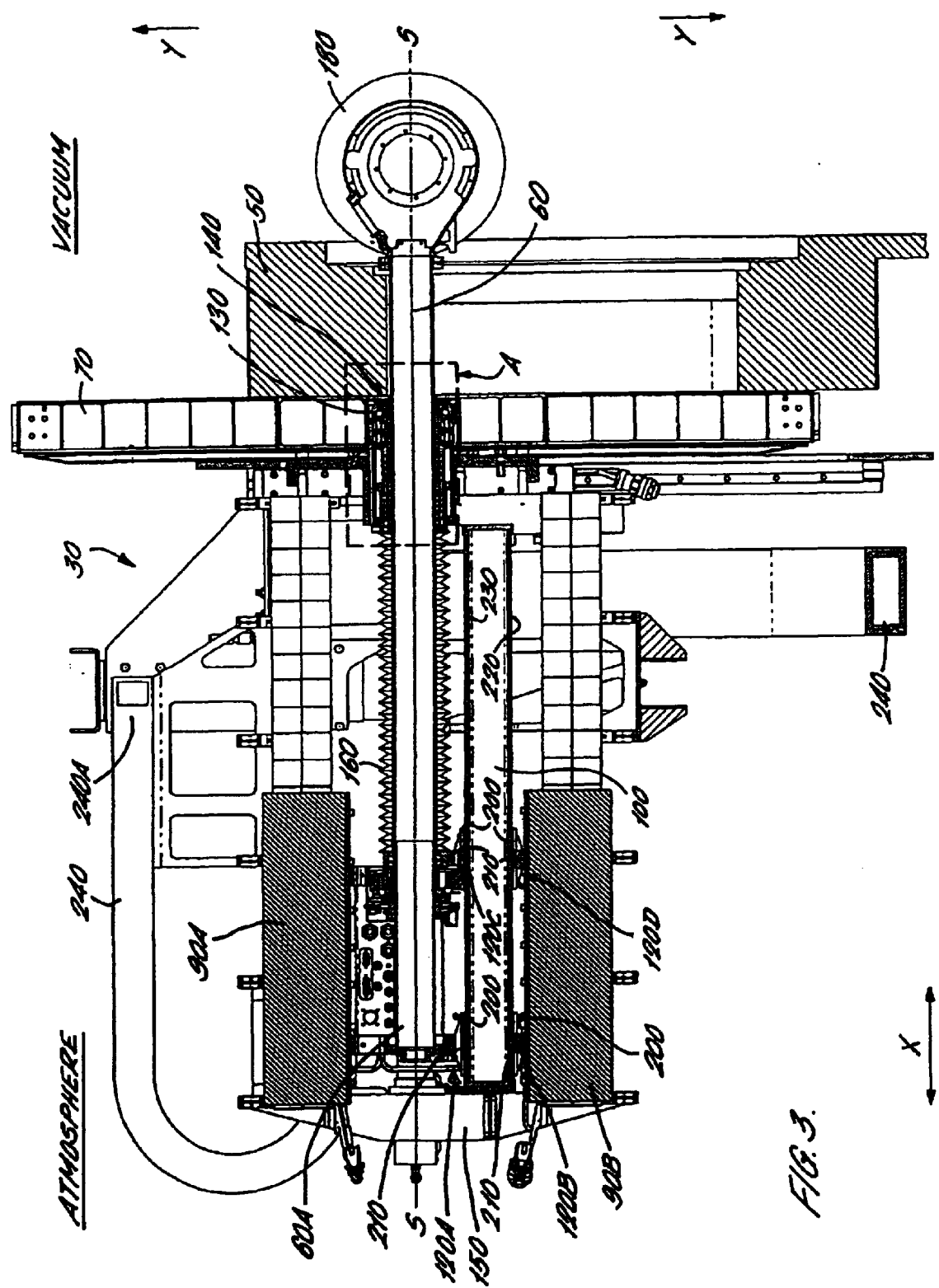
FIG. 3 shows a side sectional view of the substrate scanning arrangement of FIG. 2.

The scanning arm support structure will now be described in more detail with reference to FIGS. 2 and 3. FIG. 2 shows a more detailed preferred angle projection of the substrate scanning arrangement of FIGS. 1a and 1b, including the scanning arm support structure 30. FIG. 3 shows a side sectional view of the features illustrated in FIG. 2.

As may be seen in FIGS. 2 and 3, the scanning arm support structure 30 is cantilevered from the sledge 70. An air bearing 110 for the sledge 70 is seen (partly hidden) in FIG. 2. Further details of this differentially pumped air bearing 110 are set out in the above-referenced U.S. Pat. No.

5,898,179 and a more detailed description of this part of the substrate scanning arrangement will not be provided here.

The scanning arm 60 reciprocates in a horizontal plane and, since it has a non-trivial weight, there is a bending moment upon it. More particularly, when the scanning arm 60 is in a first, retracted position, as shown in FIG. 3, the weight of the scanning arm can be supported by the scanning arm support structure 30, the sledge 70 and the rotor plate 50. However, when it is in a generally extended position (i.e. with the scanning arm 60 moved to the right again as viewed in FIG. 3), the centre of gravity of the scanning arm 60 moves horizontally with respect to the chamber wall. Thus, there is a variation in loading for different extensions of the scanning arm. Furthermore, the scanning arm 60 is desirably rotatable about its own longitudinal axis S—S (FIG. 3) and this places yet further demands upon any feedthrough from atmosphere into vacuum as is necessary. It is also important that the surface of the scanning arm 60 does not ground upon the vacuum feedthrough as this causes wear. Furthermore, manufacturing such a cylindrical feedthrough to an appropriate tolerance, particularly in view of the variation in loading, is difficult.

To address these problems, a cantilevered support for the scanning arm 60 is instead employed. The scanning arm 60 is supported at an end 60A distal from the vacuum chamber 40, relative to the slide 100, using a set of cantilever bearings 120A, 120B, 120C and 120D. With this arrangement, the scanning arm 60 may pass into the vacuum chamber 40 through a compliant vacuum feedthrough 130. The feedthrough 130 is mounted within an aperture 140 in the sledge 70. By mounting the distal end 60A of the scanning arm 60 upon cantilever bearings 120, the feedthrough 130 does not need to provide bearing support, and instead acts only as a vacuum-tight seal for the scanning arm 60. The compliance of the feedthrough 130 accommodates any minor misalignment between the feedthrough and the cantilever bearings 120.

The feedthrough also permits rotary motion of the scanning arm 60 about its own axis S—S. This is achieved by providing a motor for driving the arm 60 at the distal end 60A. The purpose of providing for rotary motion of the arm 60 will be described below in connection with FIGS. 5 to 7.

Further details of the compliant vacuum feedthrough 130 will be provided below in connection with FIG. 4.

To drive the scanning arm 60 backwards and forwards generally along the axis S—S, a pair of linear motors 90A, 90B are provided. As is best seen from FIG. 3, these linear motors are spaced equidistantly above and below the axis S—S respectively. The linear motors are connected to the end 60A of the scanning arm 60 by a connecting bracket 150. With such an arrangement, the direction of force upon the scanning arm by the linear motors is substantially along the axis S—S, minimising the risk of any bending moment which could occur with only a single, offset linear motor.

The scanning arm 60 is enclosed, on the atmospheric side of the sledge 70, with an elastomeric gaiter 160. The gaiter 160 is supplied with dry air and prevents atmospheric contaminants from being transferred into the vacuum chamber 40 as the arm moves from left to right.

The scanning arm support structure has a significant weight which means that the control of the linear motor which drives the scanning arm support structure 30 relative to the sledge 70 in the Y-direction can be difficult. To address this problem, vacuum piston counterbalances 170, only one of which is visible in FIG. 2, are provided. The vacuum piston counterbalances 170 each have an axis generally parallel with the Y-direction. This arrangement is described in further detail in commonly assigned U.S. patent application Ser. No. 09/293,956 and in a Continuation-in-Part of that application filed on 20th Sep. 2001, the contents of each of which are incorporated by reference in their entirety. Published European Patent Application No. EP-A-1,047,102 corresponds with U.S. Ser. No. 09/293,956.

Because the end 60A of the scanning arm 60 remains at atmospheric pressure, whilst the axially opposite end of the scanning arm 60 to which a substrate support 180 is attached is maintained in the vacuum chamber 40, there is a significant force also along the axis S—S of the scanning arm 60 (in the direction from left to right in FIG. 3) in use. Again, therefore, scanning arm vacuum piston counterbalances 190 are mounted between the fixed and moving parts of the scanning arm support structure 30, as may best be seen in FIG. 2.

The cantilever bearings 120 will now be described in more detail, together with their method of mounting relative to the slide 100. Each cantilever bearing 120 comprises a bearing head and an elastomeric bearing support 210. The elastomeric bearing supports 210 of the lower cantilever bearings 120B, 120D are mounted upon the lower linear motor 90B. The upper elastomeric bearing supports 210 are mounted upon the scanning arm 60 at the distal end 60A thereof; the scanning arm 60 is however constrained to move with the upper linear motor 90A by means of the connecting bracket 150.

The bearing heads 200 of the lower cantilever bearing 120B, 120D are mounted so as to bear against a lower surface 220 of the slide 100. The bearing heads 200 of the upper cantilever bearings 120A, 120C bear against an upper surface 230 of the slide 100.

The bearing heads 200 preferably include bearing pads formed from graphite or other porous material. As is explained in the above-referenced U.S. Ser. No. 09/527,029, the use of graphite provides for a generally uniform flow rate of air across the area of the bearing surface. This in turn permits a lower "ride height" to be achieved. The slide 100 is formed from or coated with a ceramic material such as alumina such that, even if the bearing head 200 touches the surface of the slide 100 during movement, there is minimal friction between the two bearing surfaces.

In operation of the cantilever bearings 120 the bearing heads 200 are extended towards the surfaces 220, 230 of the slide 100 until they rest against it. This procedure is effected by the elastomeric bearing supports. It will be appreciated that the particular arrangement of the cantilever bearings 120 means that the bearing heads are gimballed and hence will self-level relative to the surfaces 220, 230 of the slide 100.

Once the bearing heads 200 have been tightened against the bearing surfaces 220, 230 of the slide 100, a supply of air or other fluid is provided for flow through the graphite of each bearing head 200. Each bearing head 200 has a small plenum (not shown) adjacent to the graphite bearing surface and the plenum is fed with a compressed air supply via a tube (not shown). This tube passes from the plenum, through each elastomeric bearing support 210 and then out of the scanning arm support structure 230 to supply the compressed air along cable and pipe ducts 240.

As the flow rate of air from the air supply is increased, the bearing heads 200 lift away from the surfaces 220, 230 of the slide 100 and allow the scanning arm 60 to move relative to the slide. The slide is fixed at least in the X-direction relative to the scanning arm 60 as the arm moves; preferably the slide is mounted directly to the sledge 70.

The cable and pipe ducts 240 (which carry the pipes to supply compressed air to the various air bearings) are flexible. This allows a first end of the duct 240 to be attached to a relatively fixed part of the substrate scanning arrangement, with the other end attached to a relatively moving part thereof. For example, the end 240A of the cable and pipe duct 240 (seen best in FIG. 2) does not move relative to the scanning arm support structure 30, whereas the other end 240B moves in tandem with the scanning arm 60 as it reciprocates in the X-direction.

The support structure described above permits rapid, mechanical X-Y scanning. By way of example only, the scanning arm 60 may have a stroke of about 470 mm. The scan frequency in the longitudinal (X) direction may be around 1.5 Hz. A turnaround time at each end of the longitudinal scanning movement of 78 ms introduces accelerations and decelerations of the order of 4G. The linear velocity during the main part of each stroke is about 2 m/sec. Each Y step (at the end of each longitudinal stroke) may be anywhere between zero and 30 cm and the acceleration here may be around 2G.

A preferred embodiment of the compliant vacuum feedthrough 130 will now be described with reference to FIG. 4, which shows a close-up view of the region A of FIG. 3. The feedthrough 130 is generally cylindrical and in particular has a cylindrical bore 250 whose diameter is sized to receive the cylindrical scanning arm 60 through it. The vacuum feedthrough comprises an outer sheath indicated generally at 260 and an inner sheath indicated generally at 270 and which is radially inwardly of the outer sheath 260 but generally coaxial therewith. The outer sheath 260 is fixed to the sledge 70 (part of which is shown in section in FIG. 4) adjacent the aperture 140 in the sledge (FIG. 3). The inner sheath 270 is, by contrast, suspended from the fixed outer sheath by a plurality of annular membrane seals 280. This arrangement allows the inner sheath 270 to float in the outer sheath. As explained in connection with FIGS. 2 and 3, this allows slight misalignment, particularly any slight angle between the axis S—S of the scanning arm 60 and the axis S'—S' of the bore of the feedthrough 130 to be accommodated without the scanning arm 60 touching the inner bearing surface of the feedthrough 130.

Figure 4:
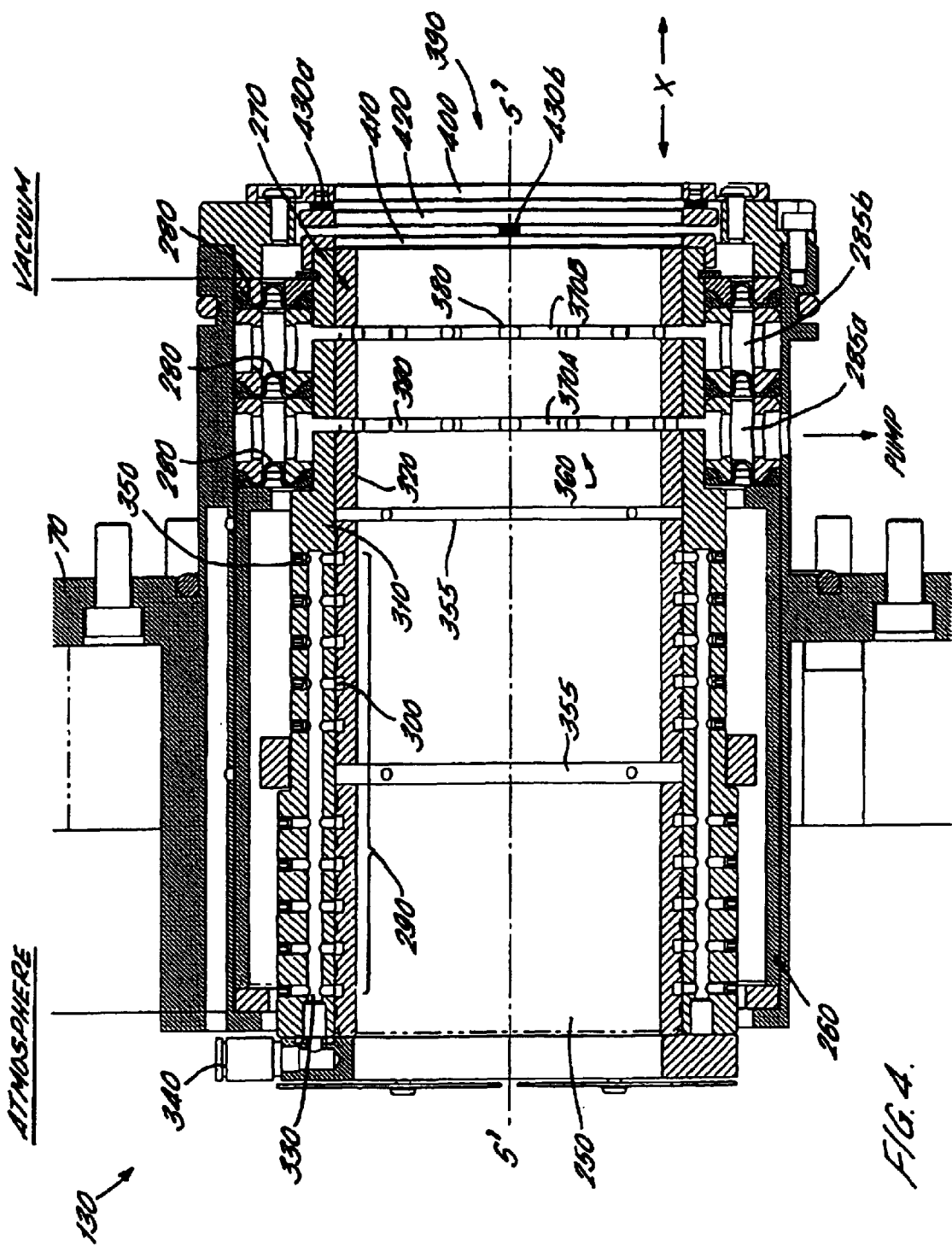
FIG. 4 shows a close-up view of the region A of FIG. 3.

The compliant vacuum feedthrough 130 provides both an air bearing between the scanning arm 60 and the inner surface of the inner sheath 270, and also a vacuum seal between the atmospheric pressure side of the feedthrough (on the left in FIG. 4) and the side of the feedthrough in vacuo (to the right in FIG. 4).

The air bearing part of the vacuum feedthrough 130 is indicated generally at 290 and is provided by a series of throughholes 300 formed radially through the inner sheath 270. The inner sheath 270 is itself formed from an outer cylinder 310 and an inner cylinder 320, the latter being an interference fit within the outer cylinder 310. The inner cylinder 320 is formed from a porous material such as graphite. The throughholes 300 are formed right through the wall of the outer cylinder 310 and into, but not through, the wall of the inner cylinder 320. Running in an axial direction through the wall of the outer cylinder 310 is a plenum which is closed at one end and opens into a connector 340 at the other end. A supply of compressed air is attached in use to the connector 340.

For ease of manufacture, the throughholes 300 are machined right through the wall of the outer cylinder 310 of the inner sheath 270 (before the latter is suspended from the outer sheath 260). The parts of the throughholes 300 which are radially outward of the plenum 330 are then blanked with grub screws or the like.

Because the scanning arm 60 and the inner diameter of the inner cylinder 320 of the inner sheath 270 are each cylindrical, and the air bearing 290 is circumferentially disposed within the inner sheath 270, the provision of compressed air to the plenum 330 causes the scanning arm 60 to be centred relative to the inner diameter of the inner cylinder 320 in use.

Circumferentially disposed atmospheric pressure vents 355 allow high pressure gas between the bearing surfaces of the scanning arm 60 and inner cylinder 320 to escape to atmosphere. A first of the vents is located axially about halfway along the length of the air bearing 290, and the second vent is located adjacent the innermost end of the air bearing 290. This prevents pressures above atmospheric from arising in the vacuum feedthrough on the vacuum side of the air bearing 290.

The second part of the vacuum feedthrough 130 is a differentially-pumped vacuum seal shown generally at 360. This comprises a series of pumping rings 370A, 370B with pumping holes disposed radially therethrough. The membrane seals 280 are, as may be seen, spaced axially between the inner and outer sheaths. The regions 285a, 285b between adjacent membrane seals 280 form compliant vacuum chambers. The pumping rings 370A, 370B are connected to these plenum chambers. Pumping apparatus (flexible vacuum hoses and a rotary pump or the like, not shown) is attached to the outer sheath, which is fixed and is also on the atmospheric pressure side of the feedthrough, with compliant feedthrough to the inner sheath. Although only two pumping rings 370 are shown in FIG. 4, it will be appreciated that more pumping rings may be desirable depending upon the efficiency of the sealing arrangement and, in particular, the efficiency of vacuum pumps attached to the vacuum pipes (and thus to the pumping rings). Other factors, such as the fly height (that is, the gap between the outer bearing surface of the scanning arm 60 and the inner face of the inner cylinder 320) will also affect the number of is differential stages in the differentially-pumped vacuum seal.

The principles of differentially-pumped vacuum seals are discussed in the above-referenced U.S. Ser. No. 09/527,029.

The right-hand side of the feedthrough 130, as seen in FIG. 4, is at the reduced pressure of the vacuum chamber 40. The left-hand side is at atmosphere. This makes no difference to the outer sheath 260 which is fixedly mounted to the sledge 70. The inner sheath 270, however, floats within the outer sheath 260 and the significant force (from left to right in FIG. 4) due to the pressure differential requires that the inner sheath 270 be axially supported to prevent the membrane seals 280 from shearing.

To provide such axial support, whilst still permitting compliance of the inner sheath 270 at least in the radial direction thereof, a thrust bearing assembly 390 is provided at the vacuum end of the feedthrough 130. The thrust bearing assembly 390 comprises an annular reaction washer 400 which is screwed, rivetted or otherwise fixedly attached to the outer sheath 260 and is thus not movable. A pair of thrust washers 410, 420 are provided axially inwardly of the reaction washer 400. The first thrust washer 410 rests against a collar at the vacuum end of the inner sheath 270.

The first thrust washer 410 has a pair of diametrically opposed thrust buttons 430*b* (only one of which is visible in FIG. 4), mounted upon a face of the first thrust washer. In use, the thrust buttons 430*b* of the first thrust washer bear against an opposing surface of the second thrust washer.

Thus, the first thrust washer 410 is able to rock about a pivot provided by the two diametrically opposed thrust buttons 430*b* in the X-Y plane.

The second thrust washer 420 in turn has a pair of diametrically opposed thrust buttons 430*a* which bear against a face of the reaction washer 400. The thrust buttons 430*a* are arranged orthogonally to the thrust buttons 430*b* of the first thrust washer 410, and thus permit the second thrust washer to rock in the orthogonal (X-Z) plane.

By arranging the diametrically opposed thrust buttons 430*b* on the first thrust washer 420 orthogonally from the diametrically opposed thrust buttons 430*a* on the second thrust washer 420, the inner sheath 270 is thus gimballed against the reaction washer 400 of the thrust bearing assembly 390 whilst the thrust bearing assembly 390 provides a reaction against the force due to atmospheric pressure. The force urges the first and second thrust washers against each other and against the reaction washer 400 so that they are held in place axially without requiring further fixing when the vacuum chamber is evacuated.

As an alternative to the thrust bearing assembly 390, or in addition to it, the inner sheath 270 can be supported against the axial force from atmospheric pressure by, for example, piano wire attached between the atmospheric pressure end of the inner sheath 270 of the vacuum feedthrough and a fixed mounting point upon the sledge 70, for example. Whilst this arrangement is simpler than the gimballed thrust bearing assembly 390, it is potentially not as robust.

Figure 5:
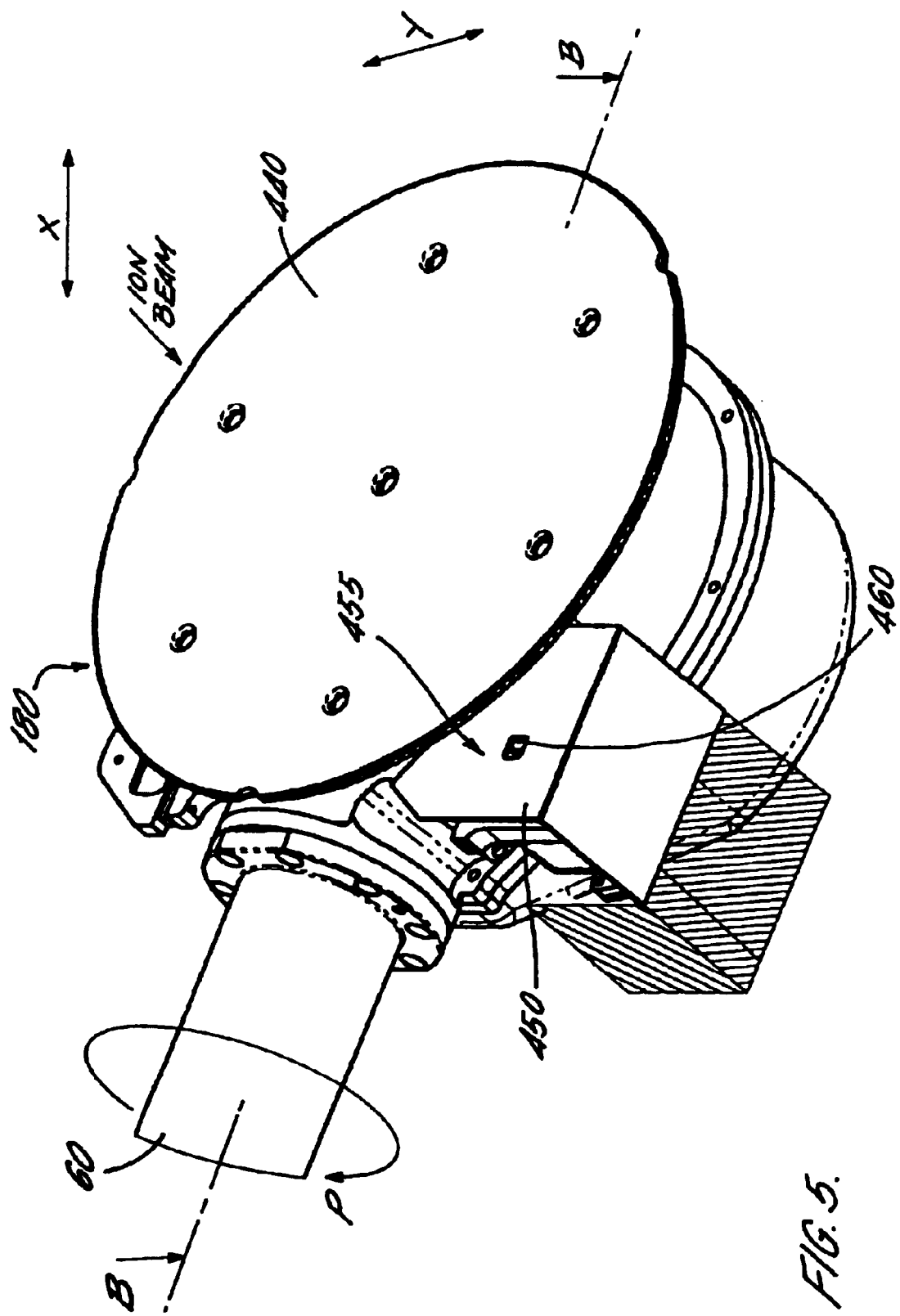
FIG. 5 shows a third angle projection of a substrate support attached to the substrate scanning arrangement of FIGS. 1 to 4, and including a Faraday.

Turning now to FIG. 5, a third angle projection of the substrate support 180 and the end of the scanning arm 60 to which it is attached is shown. The substrate support 180 includes a chuck to hold electrostatically a semiconductor wafer of 300 mm diameter or the like. The chuck 440 holds the semiconductor wafer electrostatically in a manner well known in the art. Mounted adjacent to the chuck 440 is a first Faraday 450, the details of which will be described in connection with FIG. 9 below. The first Faraday 450 is generally rectilinear and has a front face 455 which is generally parallel with and coplanar with the face of the chuck 440 onto which the wafer is mounted. A Faraday aperture 460 is formed within the front face 455 of the first Faraday 450. Typically, the aperture has an area of about 1 cm$^2$.

The first Faraday 450 is used for beam profiling prior to implant of a wafer, that is, it is used to measure the current density across the incident ion beam in the X and Y-directions (the two Cartesian directions orthogonal to the direction of the ion beam). Such information is desirable to ensure accurate dosing of the wafer to be implanted, to avoid wafer charging damage during implant, and because the lateral position (center of gravity) of the beam defines the wafer angle alignment.

The ion beam is, as previously explained, held in a fixed direction during implantation. The direction and dimensions of the ion beam can, however, be "tuned" prior to implant by, for example, adjusting physical and electrical parameters of the ion source which generates the ion beam. To measure the current density of the ion beam prior to implant, using the arrangement of FIG. 5, the following procedure is followed. Firstly, a dummy wafer is mounted to the chuck 440. This is typically carried out by extending the scanning arm 60 vertically along the sledge 70 (FIGS. 1–3) to the extent of its travel in the Y-direction. The plane of the chuck 440 is rotated from the vertical to the horizontal by actuation of the rotary motor of the scanning arm 60, so that the scanning arm is rotated about its own axis in the direction P shown in FIG. 5 until horizontal. The dummy wafer is loaded by a robot arm in a load lock which can be vented to atmosphere without needing to vent the vacuum chamber 40.

Once the dummy wafer has been loaded, the substrate support 180 is rotated back so that the chuck 440 is in the vertical position (i.e., into the X-Y plane) and then the scanning arm support structure 30 is moved along the sledge 70 until the fixed direction ion beam is level with the aperture 460 in the Faraday, in the Y-direction. To profile the beam, the linear motors 90A, 90B are then actuated so that the Faraday 450 and the substrate support 180 move together in the X-direction.

In practice, the ion current density drops off slowly (i.e., not vertically) at the edges of the ion beam. It is important to know what the profile of the beam is, particularly in the Y-direction, since in use the wafer is typically scanned in a raster fashion across the beam. In other words, the scanning arm 60 is reciprocated from left to right whilst the scanning arm support structure 30 remains in a fixed position relative to the sledge 70, until the whole of the substrate support has traversed the ion beam in the X-direction. The scanning arm support structure 30 is then moved vertically, that is, in the Y-direction by a distance related to the height of the beam in the Y-direction, whereupon the scanning arm 60 is moved back again from right to left with the scanning arm support structure 30 once more maintained stationary relative to the sledge 70. By repeating this procedure, the whole of the wafer may be implanted. In order to ensure that stripes of higher or lower ion density are not created in the Y-direction, it is important to measure the beam profile prior to implant. Profile measurements are fed to a processor which controls the step size in the Y-direction so that the net implantation density of ions is maintained relatively constant across the wafer in that Y-direction.

The Faraday 450 is thus scanned across the ion beam with the dummy wafer in place, prior to implant, by moving the scanning arm support structure 30 relative to the sledge 70 so that the aperture 460 in the Faraday 450 moves across the ion beam in the Y-direction. The charge collected by the Faraday is measured as a function of distance (or time), and from this a profile of the ion beam in the Y-direction can be determined and used to set the parameters for the scanning of a wafer to be implanted.

Once the Y-direction profile has been obtained, the X-profile can also be obtained by maintaining the scanning arm support structure 30 at a fixed position relative to the sledge 70 and then extending the scanning arm 60 using the linear motors 90A and 90B which moves the aperture 460 of the Faraday 450 across the ion beam. This is shown schematically in FIG. 6. It will be noted that, typically, the area of the ion beam is larger than the aperture 460; for low ion implantation energies (of order 1–5 kev) the ion beam has a relatively large area which decreases with increasing ion energy.

Whilst the profile of the ion beam in the Y-direction is of particular use to ensure correct dosing during implant, the profiles in the X and Y-directions are also useful for beam tuning prior to implant. If the measured profile in the X and Y-directions is considered by an operator (or by a processor suitably programmed) not to be optimised, then the beam line can be adjusted and the profiles re-measured using the techniques described above prior to implantation.

As an alternative to the procedure described above (which requires mounting and de-mounting of a dummy wafer), a dual Faraday arrangement may instead be employed and this will now be described by reference to FIG. 7 which shows a schematic sectional view along the line B—B of FIG. 5. The arrangement of FIG. 7 employs both a first Faraday 450 for use as described previously, and also a second Faraday 470 mounted diametrically opposite to the first Faraday 450, also upon the scanning arm 60. The second Faraday 470 includes its own aperture 480. The second Faraday 470 and the aperture 480 therein face "backwards" when the chuck 440 faces towards the ion beam as in FIG. 5. However, by rotating the scanning arm 60 through 180° about its own axis P (FIG. 5), the second Faraday may instead then face towards the incident ion beam, as seen in FIG. 7, with the chuck 440 then facing backwards along with the first Faraday 450.

The substrate support 180 has a body 490, at least the rear of which may be coated with a semiconductor material to form a semiconductor layer 500. The part of the scanning arm 60 adjacent to the substrate support 180 is likewise preferably coated with a semiconductor material. Other suitable materials which either do not sputter or sputter material that will not contaminate the beam line may be used to form the layer on the substrate support and/or scanning arm instead, such as graphite. With this arrangement, no dummy wafer is required as the layer 500 provides this function instead. Beam profiling can then be carried out using the second Faraday 470 in exactly the same manner as has been described above in connection with the first Faraday 450.

In order to maintain the benefit of mounting the Faraday or Faradays upon the substrate support, it is desirable that the distance between the charge collection in the second Faraday and the longitudinal axis of the scanning arm 60 is the same as the distance between the point at which charge is collected in the first Faraday 450 and that longitudinal axis. Provided that this geometry is maintained, then the charge collector in the second Faraday 470 will lie in the same plane as the wafer to be implanted will lie when the substrate support 180 is rotated so that the chuck 440 faces forward towards the ion beam again.

Although two separate Faradays 450, 470 are shown in FIG. 7, it is to be understood that a single physical structure incorporating apertures on opposing faces and a common (or abutting) dividing member can equally be employed.

Indeed, the possibility of cross contamination (that is, sputtering of previous beam species onto subsequent wafers) means that it may in fact be preferable to employ only a single Faraday on the reverse side of the substrate support 180, that is, to have only the second Faraday 470 in FIG. 7, so that the aperture of that single Faraday is hidden from the beam during implantation.

When a Faraday is employed that faces away from the front face of the substrate support (e.g the Faraday 470 of FIG. 7), the front face of the substrate support will face backwards when that Faraday faces towards the beam. The front face then can become coated with contaminant material which arises from back-sputtering of ions from the beam stop downstream of the substrate support. To avoid this, it is desirable to include a shield that can be dropped down over the front face of the substrate support. Such a shield may either be mounted onto the scanning arm 60 or may be suspended for example from the chamber wall.

FIG. 8 shows an alternative arrangement of a substrate support or scanning arm Faraday. FIG. 8 shows a view looking along the beam line towards the Here, the Faraday 490 is mounted at an angle of 90° to the planes of the chuck 440 and rear face of the substrate support. In this case, when the aperture 460 faces towards the ion beam, the chuck 440 faces upwards and hence away from both the beam and any back sputtered material. Although a 90° angle between the plane of the Faraday aperture and the plane of the chuck is preferred, other angles such as about 120° may be employed (such that the chuck 440 faces slightly backwards from the incident ion beam).

A sectional view of a preferred embodiment of a Faraday 450 is shown in FIG. 9. The Faraday comprises a magnetic stainless steel housing 510 which is enclosed on three sides and which has the aperture 460 within the front face 455. The edges of the front face 455 which define the aperture 460 are formed as a knife edge 520 for purposes which will be described below.

Within the housing 510 is an electrometer 530 connected to an outer stainless steel screen 540 and an inner graphite cup 550. A pair of permanent magnets 560 are located between the inner walls of the housing 510 and the outer walls of the graphite cup 550.

The purpose of the rotor plate 50 seen in particular in FIGS. 1a and 1b is to allow the Y-direction scanning to be carried out in a plane other than the vertical. The knife edge 520 of the Faraday 450 shown in FIG. 9 accommodates such high implant angles. It is particularly desirable that the ion beam profile is measured with the chuck and hence the Faraday at the angle of subsequent desired implant.

It will be understood that the arrangement of FIG. 9, described in relation to the first Faraday 450, is equally applicable to the second Faraday 470 (FIG. 7). In particular, even if beam profiling is carried out with the rear of the substrate support 180 facing towards the ion beam as is shown in FIG. 7, the knife edge 520 is still desirable.

Moreover, although the use of a Faraday mounted upon the scanning arm and/or adjacent to the substrate support has been described in terms of beam profiling prior to implant, in the case where the aperture in the (or one of the) Faraday(s) faces forwards (i.e., in the same direction as the chuck), that Faraday can be used also for beam profiling during implantation as well. More particularly, when the Faraday is mounted close to the wafer on the chuck, so that the Faraday aperture is likewise close to the edge of the wafer and also faces towards the incident beam during implantation, it is possible to arrange for both the wafer and the Faraday to pass in front of the beam, at least over the part of the raster scan (in the Y direction) that is coincident with the Faraday aperture. Thus, a complete beam profile can be obtained at least once per total wafer scan (all X and all Y positions scanned). Indeed, by mounting two or more Faradays each facing forwards and each spaced in the Y direction, more than one beam profile per total wafer scan could be obtained.

Whilst various specific embodiments have been described, it is to be understood that these are for the purposes of illustration only and that various modifications may be made without departing from the scope of the invention which is to be determined in accordance with the accompanying claims. It is moreover to be appreciated that the various features of the present invention may be used together or separately.

What is claimed is:

1. Semiconductor processing apparatus, comprising:
   a vacuum chamber having a chamber wall defining an aperture therein;
   an elongate member extending through the aperture in the chamber wall and being movable in a longitudinal direction through the chamber wall;
   an elongate member driver arranged to cause reciprocation of the elongate member in the said longitudinal direction;

a carrier external of the vacuum chamber, for supporting the elongate member and driver; and a carrier driver arranged to cause reciprocation of the carrier in a direction generally perpendicular to the direction of reciprocation of the movable elongate member.

2. The apparatus of claim 1, in which the elongate member driver is a linear motor to which the elongate member is attached.

3. The apparatus of claim 1, in which the carrier driver is a linear motor.

4. The apparatus of claim 1, in which the movable elongate member is mounted upon a slide, the slide being cantilevered from the said carrier.

5. The apparatus of claim 4, further comprising a linear motor arranged to drive the elongate member relative to the slide.

6. The apparatus of claim 1, in which the chamber wall defines an aperture, the carrier acts as a movable cover for the said aperture, and wherein the elongate member extends through the carrier and through the aperture of the chamber wall.

7. The apparatus of claim 6, wherein the carrier includes a feedthrough for the elongate member, the elongate member and the feedthrough together defining a vacuum-tight seal.

8. The apparatus of claim 7, in which the feedthrough includes a compliant seal structure, the elongate member being supported relative to the carrier by at least one bearing which is in turn spaced from the feedthrough.

9. The apparatus of claim 8, in which the compliant seal structure includes a fluid bearing.

10. The apparatus of claim 1, further comprising a force compensator arranged to counterbalance a fixed force acting upon the movable elongate member.

11. The apparatus of claim 6, further comprising a vacuum-tight fluid bearing disposed between the chamber wall and the carrier, the fluid bearing being adjacent the aperture.

12. The apparatus of claim 1, wherein the elongate member is further rotatable about an axis parallel with the said longitudinal direction.

13. The apparatus of claim 1, wherein the carrier is further rotatable about an axis parallel with the said longitudinal direction.

14. The apparatus of claim 13, further comprising a base supported by the chamber wall and an annular rotor rotatably mounted upon the said base, the annular rotor having first and second generally planar faces; wherein the carrier is mounted upon one of the generally planar faces of the annular rotor and arranged for reciprocal movement across the said one of the generally planar faces of the annular rotor.

15. Semiconductor processing apparatus, comprising:

a vacuum chamber having a chamber wall;

an elongate member extending horizontally through the chamber wall and being movable in a longitudinal direction through the chamber wall;

an elongate member driver arranged to drive the elongate member in the said longitudinal direction;

a support for the elongate member and said driver, the support being external of the vacuum chamber and providing cantilever support for an external end of the elongate member; and a feedthrough into the vacuum chamber, the feedthrough receiving the elongate member and including a vacuum seal for sealing against the elongate member.

16. The apparatus of claim 15, wherein the vacuum seal is compliant.

17. The apparatus of claim 15, in which the support includes a slide along which the elongate member is arranged to move, the apparatus further comprising a fluid bearing between the elongate member and the slide.

18. The apparatus of claim 17, in which the fluid bearing comprises a support member arranged to support the elongate member relative to the slide, and a gimballed head forming a first fluid bearing surface, the elongate member forming a second fluid bearing surface.

19. The apparatus of claim 18, wherein the support member of the fluid bearing is compliant in a direction generally perpendicular to the said first and second fluid bearing surfaces.

20. The apparatus of claim 15, in which the elongate member driver comprises at least one linear motor.

21. The apparatus of claim 20, wherein the elongate member is interposed between two linear motors.

22. The apparatus of claim 21, in which the support includes a slide whose location is fixed relative to the said support, the apparatus further comprising a first bearing disposed between the slide and the first linear motor, and a second bearing between the slide and the elongate member.

23. The apparatus of claim 22, in which the first bearing comprises a plurality of fluid bearing members disposed so as to support the elongate member towards the said end thereof, each fluid bearing comprising a support member which is compliant in a direction generally perpendicular to the longitudinal axis of the elongate member, and a gimballed head forming a first fluid bearing surface, the slide providing a second fluid bearing surface for each fluid bearing member.

24. The apparatus of claim 15, wherein the said feedthrough is compliant in a direction perpendicular to the longitudinal axis of the elongate member, and wherein the vacuum seal is a differentially pumped vacuum seal.

25. The apparatus of claim 15, wherein the elongate member is generally circular in section, the apparatus further comprising rotary drive means arranged selectively to rotate the elongate member about its longitudinal axis.

26. The apparatus of claim 15, further comprising a force compensator arranged to counterbalance a fixed force acting upon the movable elongate member.

27. The vacuum seal of claim 15, in which the axial support comprises a reaction plate adapted to be fixed relative to said chamber wall.

28. The vacuum seal of claim 27, in which the axial support further comprises a gimballed thrust plate arrangement which urges against the reaction plate.

29. The vacuum seal of claim 28, wherein the gimballed thrust plate arrangement includes first and second thrust plates, each thrust plate comprising two diametrically opposed thrust buttons, the thrust buttons on the first thrust plate being orthogonally offset from the thrust buttons on the second thrust plate, and wherein the thrust buttons of the first thrust plate are urged in use against the second thrust plate and the thrust buttons of the second thrust plate in turn are urged in use against the reaction plate.

30. The vacuum seal of claim 15, wherein the axial support comprises a high tensile strength wire, anchored relative to the bearing body so as to be tensioned in use by said axial force.

31. The vacuum seal of claim 15, wherein the inner bearing provides a first rotary bearing surface, the elongate member provides a second rotary bearing surface, and wherein the vacuum seal is provided with a supply of fluid so as to form a fluid bearing between the said first and second rotary bearing surfaces.

32. The vacuum seal of claim 31, in which the vacuum seal further comprises a differentially pumped groove within the inner bearing so as to maintain a pressure differential between a first part of the elongate member on the atmospheric pressure side of the vacuum seal and a second part of the elongate member within the vacuum chamber.

33. Semiconductor processing apparatus, comprising:
 a vacuum chamber having a chamber wall with an aperture therein;
 a substrate scanning arrangement including an elongate arm extending through the aperture in the chamber wall, and a substrate support attached to a first end of the elongate arm and located within the vacuum chamber, the substrate support comprising a front face adapted to receive a substrate to be processed, and a rear face opposed to the front face;
 a mechanical scanner for moving the substrate scanning arrangement in a first direction generally longitudinally through the chamber wall, and in a second direction generally orthogonal to the said first direction; and
 a Faraday, mounted on said arm adjacent to and in fixed relation to the said substrate support.

34. The apparatus of claim 33, further comprising:
 rotary drive means for rotating the substrate support about an axis parallel with the said first direction of movement of the elongate arm between a first position in which the said front face of the substrate support faces toward an incident ion beam, and a second position in which the said rear face of the substrate support faces towards that incident ion beam.

35. The apparatus of claim 34, wherein the Faraday is mounted adjacent the said front face of the substrate support, the apparatus further comprising a second Faraday mounted adjacent to and in fixed relation to the rear face of the substrate support for beam profiling when the substrate support is rotated into said second position.

36. The apparatus of claim 34, wherein the said Faraday has front and rear openings, the front opening being arranged adjacent the front faces of the substrate support, and the rear opening being arranged adjacent the rear face of the said substrate support.

37. The apparatus of claim 34, in which the rear face of the substrate support is formed from or coated with a material selected from the list comprising a semiconductor material and graphite.

38. The apparatus of claim 34, in which the elongate arm is coated with a material selected from the list comprising a semiconductor material and graphite.

39. Semiconductor processing apparatus, comprising:
 a vacuum chamber having a chamber wall defining a chamber wall aperture therein and separating an inside and an outside of the chamber;
 a base supported by the chamber wall;
 an annular rotor rotatably mounted upon the said base, the annular rotor defining a rotor aperture which is coincident with the chamber wall aperture, the rotor having first and second generally planar faces;
 an elongate member having a longitudinal direction extending through the rotor and chamber wall apertures, said elongate member having an inner end on the inside of the chamber and an outer end on the outside of the chamber, and said elongate member being movable in said longitudinal direction through the rotor and the chamber wall;
 an elongate member driver arranged to cause reciprocation of the elongate member in the said longitudinal direction to impart a corresponding movement in said longitudinal direction to said inner end of said elongate member on the inside of said chamber;
 a carrier mounted adjacent a first, external face of the rotor, for supporting the elongate member and driver; and
 a carrier driver arranged to cause reciprocation of the carrier in a direction generally perpendicular to the direction of reciprocation of the movable elongate member.

40. A vacuum seal for an elongate member having a longitudinal axis to extend through a chamber wall of a vacuum chamber, to allow longitudinal and/or rotational movement of the elongate member relative to the chamber wall, the elongate member having an axially extending sealing surface, the vacuum seal comprising:
 a bearing body having an aperture along an axis to receive the elongate member coaxially therein and provide a vacuum seal with said axially extending sealing surface of the elongate member which allows said longitudinal and/or rotational movement of the elongate member relative to said bearing body; and
 a compliant mount to mount said bearing body on the chamber wall to allow the bearing body to move relative to said chamber wall compliantly with any movement of the elongate member transverse to said longitudinal axis, said compliant mount having an axial support to prevent axial movement of the bearing body inwards into the vacuum chamber under an axial force applied to the bearing body by atmospheric pressure, whilst permitting said compliant movement of the bearing body.

41. Semiconductor processing apparatus comprising:
 a vacuum chamber having a chamber wall separating an inside and an outside of the chamber;
 an elongate member having a longitudinal axis extending through the chamber wall and mounted for longitudinal movement inwards and outwards relative to the chamber wall;
 a vacuum feedthrough to receive the elongate member and provide a vacuum seal between the elongate member and the chamber wall;
 a guide fixed externally to the chamber wall and extending parallel to the elongate member,
 a carriage carrying an external end of the elongate member and mounted to travel along the guide on movement of said elongate member in said longitudinal direction,
 and a rotation drive motor mounted on the carriage and operable to effect rotation of the elongate member about its axis.

42. The vacuum seal of claim 40, wherein the compliant mount comprises an outer mounting for fixing to the wall of the vacuum chamber and defining an aperture containing said bearing body radially inwardly of said outer mounting, and a plurality of compliant annular gaskets sealing at axially spaced locations between said outer mounting and said bearing body.

43. Semiconductor processing apparatus, comprising:
 a vacuum chamber having a chamber wall with an aperture therein;
 a substrate scanning arrangement including an arm extending through the aperture in the chamber wall, and a substrate support attached to an inner end of the arm located within the vacuum chamber, the substrate support comprising a front face adapted to receive a substrate to be processed, and a rear face opposed to the front face;

a scanning arrangement drive for the substrate scanning arrangement to provide two dimensional scanning of the substrate support in the vacuum chamber in a first direction and in a second direction generally orthogonal to the said first direction; and a Faraday, mounted on said arm adjacent to and in fixed relation to the said substrate support.

44. A method of providing linear reciprocating movement to a wafer holder in a vacuum chamber of a semiconductor processing apparatus, the method comprising:

a) mounting the wafer holder on an inner end inside the vacuum chamber of an elongate scan arm having a longitudinal axis extending horizontally through a vacuum chamber wall to an outer end of the scan arm outside the vacuum chamber;

b) providing a cantilever support for the scan arm and the wafer holder at said outer end, c) driving said scan arm in said longitudinal direction to provide linear reciprocation of said wafer carrier, and d) providing a non-load bearing vacuum seal between the chamber wall and said elongate scan arm.

* * * * *